(12) United States Patent
Calderone

(10) Patent No.: US 6,477,182 B2
(45) Date of Patent: *Nov. 5, 2002

(54) DATA TRANSMISSION METHOD AND APPARATUS

(75) Inventor: Theodore Calderone, San Carlos, CA (US)

(73) Assignee: Diva Systems Corporation, Redwood City, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/327,791

(22) Filed: Jun. 8, 1999

(65) Prior Publication Data

US 2002/0051461 A1 May 2, 2002

(51) Int. Cl.[7] .............................. H04J 1/08; H04J 1/06
(52) U.S. Cl. ..................... 370/481; 370/343; 370/480; 455/43; 455/118; 455/130; 455/196.1; 455/255
(58) Field of Search ...................... 348/724; 370/480, 370/481, 482, 485, 343; 455/43, 130, 118, 196.1, 255

(56) References Cited

U.S. PATENT DOCUMENTS

| | | | | |
|---|---|---|---|---|
| 3,648,178 A | * | 3/1972 | Hershberg | 325/145 |
| 4,068,104 A | * | 1/1978 | Werth et al. | 179/175.3 R |
| 4,506,383 A | * | 3/1985 | McGann | 455/17 |
| 4,509,206 A | * | 4/1985 | Carpe et al. | 455/245 |
| 4,520,507 A | * | 5/1985 | Moon | 455/3 |
| 4,630,285 A | * | 12/1986 | Dyer et al. | 375/37 |
| 4,706,243 A | * | 11/1987 | Noguchi | 370/69.1 |
| 4,788,590 A | * | 11/1988 | Arai | 358/143 |
| 4,956,864 A | * | 9/1990 | Brockman | 380/34 |
| 5,038,344 A | * | 8/1991 | Kawamura | 370/70 |
| 5,058,107 A | * | 10/1991 | Stone et al. | 370/69.1 |
| 5,175,882 A | * | 12/1992 | Higashijima | 455/234.1 |
| 5,504,783 A | * | 4/1996 | Tomisato et al. | 375/267 |
| 5,528,283 A | * | 6/1996 | Burton | 348/13 |
| 5,532,760 A | * | 7/1996 | Inoue | 348/729 |
| 5,625,624 A | * | 4/1997 | Rosen et al. | 370/307 |
| 5,646,947 A | * | 7/1997 | Cooper et al. | 370/510 |
| 5,666,487 A | | 9/1997 | Goodman et al. | 395/200.76 |
| 5,729,281 A | * | 3/1998 | Utsumi et al. | 348/12 |
| 5,737,034 A | * | 4/1998 | Rhee | 348/738 |

(List continued on next page.)

OTHER PUBLICATIONS

EUTELSAT. "Recommended Transmission Parameters for Broadcasters/Operators of Direct–To–Home FM TV Services." Feb. 25, 1998. Technical Guide.*

Primary Examiner—Hassan Kizou
Assistant Examiner—Joe Logsdon
(74) Attorney, Agent, or Firm—Moser, Patterson & Sheridan, LLP

(57) ABSTRACT

A method and apparatus for modulating a plurality of information signals onto respective unique intermediate frequency (IF) carrier signals, summing the respective IF carrier signals to provide a stacked IF carrier signal and upconverting the stacked IF carrier signal to a radio frequency (RF). Advantageously, the invention reduces the cost and complexity of modulation and frequency conversion processes in those systems requiring a multiplicity of audio, video or data carriers placed side by side or in a consecutive order within a defined frequency spectrum.

23 Claims, 1 Drawing Sheet

U.S. PATENT DOCUMENTS

| | | | | |
|---|---|---|---|---|
| 5,864,547 A | * | 1/1999 | Strodtbeck et al. | 370/318 |
| 5,867,485 A | * | 2/1999 | Chambers et al. | 370/281 |
| 5,877,821 A | | 3/1999 | Newlin et al. | 348/724 |
| 5,926,547 A | * | 7/1999 | Heieis et al. | 380/10 |
| 5,930,231 A | * | 7/1999 | Miller et al. | 370/210 |
| 5,959,592 A | * | 9/1999 | Petruzelli | 343/840 |
| 5,974,302 A | * | 10/1999 | Adamiecki et al. | 455/84 |
| 6,006,075 A | * | 12/1999 | Smith et al. | 455/101 |
| 6,049,551 A | * | 4/2000 | Hinderks et al. | 370/468 |
| 6,052,364 A | * | 4/2000 | Chalmers et al. | 370/312 |
| 6,097,929 A | * | 8/2000 | Hassall et al. | 455/12.1 |
| 6,128,276 A | * | 10/2000 | Agee | 370/208 |
| 6,134,223 A | * | 10/2000 | Burke et al. | 370/265 |
| 6,212,201 B1 | * | 4/2001 | Hinderks et al. | 370/468 |
| 6,353,490 B1 | * | 3/2002 | Singer et al. | 359/145 |

* cited by examiner

DATA TRANSMISSION METHOD AND APPARATUS

The invention relates to communication systems generally and, more specifically, the invention relates to a low noise block converter method and apparatus suitable for use in a data transmission system.

BACKGROUND OF THE DISCLOSURE

In information distribution systems utilizing radio frequency (RF) modulation techniques it is well known to modulate each of a plurality of information signals, such as audio, video or data signals onto respective intermediate frequency (IF) carrier signals having a common frequency. The respective IF carrier signals are then modulated onto respective RF carrier frequencies, which are then transmitted to a receiver. The receiver tunes and demodulates an RF carrier frequency including a desired IF modulated information signal. An IF demodulator then retrieves the desired information signal.

Currently in Community Access Television or CATV applications, it is common practice to use Frequency Division Multiplexing (FDM) as a means of inserting a multiplicity of audio, visual or data carriers onto a single cable or optical fiber for transport to the subscriber. That is, each of a plurality of, illustratively, 6 MHz bandwidth television signals are modulated onto adjoining radio frequency RF channel slots and transmitted to receivers within the CATV system. These channels are typically arranged side by side in a consecutive manner with little or no gaps from the first RF carrier (Lowest Frequency) to the last RF carrier (Highest frequency).

Specifically, a first step in the CATV FDM process comprises modulating each of a plurality of baseband information signals (e.g., each television signals) onto a standard intermediate frequency to produce a corresponding plurality of IF modulated signals. In the United States, the IF is typically 43.75 MHz for analog video and 44 MHz for digitally modulated video or digitally modulated data. A second step in the CATV FDM process comprises upconverting each of the plurality of IF modulated signals onto a corresponding plurality of respective RF carrier signals, which are then transmitted. Thus, the CATV FDM process utilizes, for each baseband information signal, a respective IF modulator and a respective RF upconverter.

Therefore, it is seen to be desirable to provide a reduced cost method and apparatus for providing a plurality of information streams to receivers within an information distribution system. Moreover, it is seen to be desirable to specifically reduce the amount of processing (and associated circuitry) required to prepare and transmit the plurality of information streams, such as within a CATV system.

SUMMARY OF THE INVENTION

The disclosure describes a method and apparatus for modulating a plurality of information signals onto respective unique intermediate frequency (IF) carrier signals, summing the respective IF carrier signals to provide a stacked IF carrier signal and upconverting the stacked IF carrier signal to a radio frequency (RF). Advantageously, the invention reduces the cost and complexity of modulation and frequency conversion processes in those systems requiring a multiplicity of audio, video or data carriers placed side by side or in a consecutive order within a defined frequency spectrum.

Specifically, an upconverter according to the invention comprises: a plurality of modulators for modulating respective information signals onto respective intermediate frequency (IF) carrier signals, the respective IF carrier signals being separated by a predetermined frequency; a summation module, for summing the plurality of IF carrier signals to produce a stacked IF carrier signal; a first mixer, for spectrally shifting to a first frequency range, the stacked IF carrier signal, the first frequency range comprising frequencies greater than frequencies of the IF carrier signals; and a second mixer, for spectrally shifting to one of a plurality of spectral portions within a second frequency range, information within the first frequency range, the second frequency range comprising frequencies less than the first frequency range.

BRIEF DESCRIPTION OF THE DRAWING

The teachings of the present invention can be readily understood by considering the following detailed description in conjunction with the accompanying drawing, in which.

DETAILED DESCRIPTION

Figure 1:
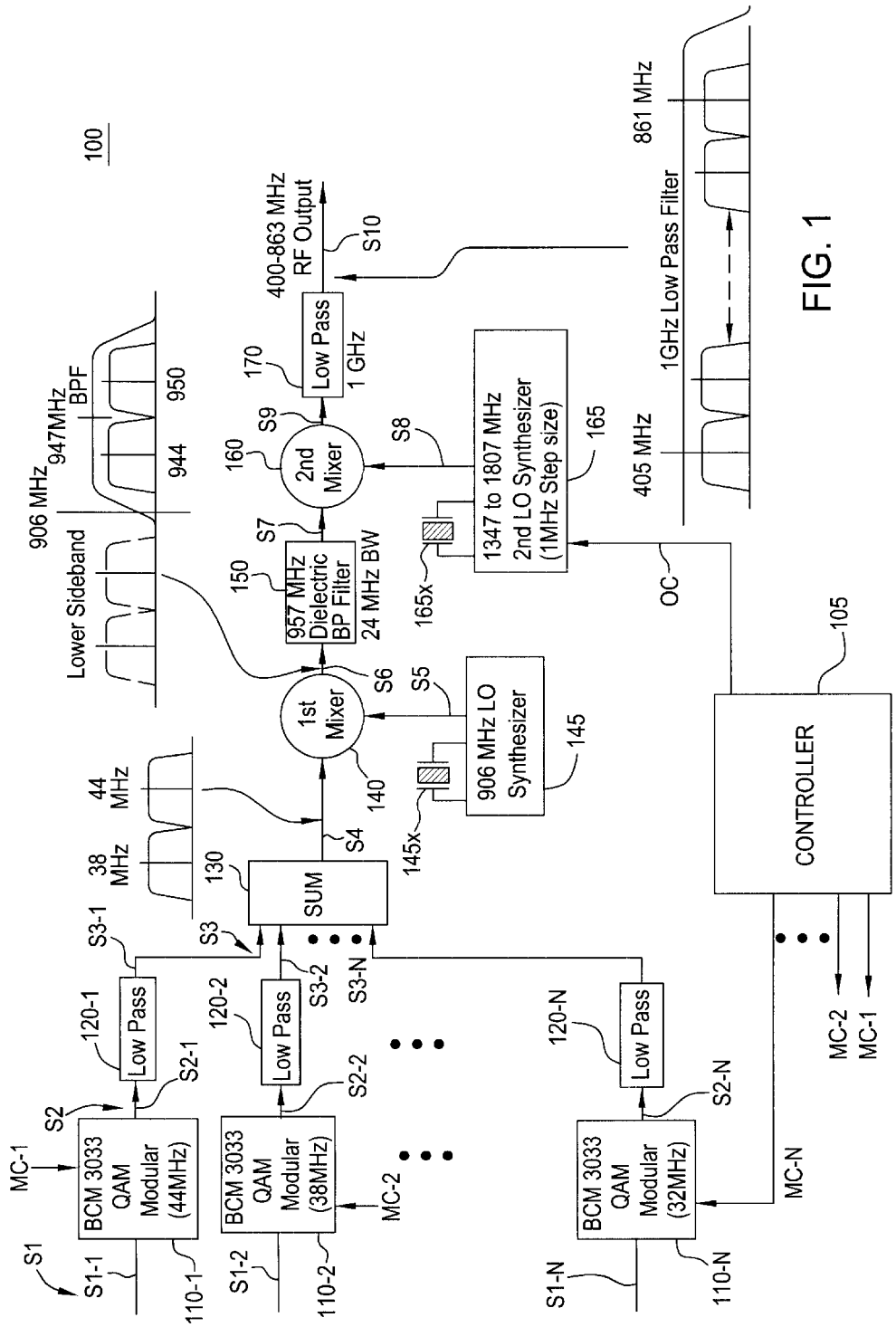
FIG. 1 depicts a high level block diagram of a multiple carrier frequency up conversion system.

The invention will be described within the context of an information distribution system, illustratively a video information distribution system. However, it will be apparent to one of ordinary skill in the art that the invention is also applicable other information distribution systems utilizing intermediate frequency (IF) modulation of a plurality of information streams prior to modulating the IF modulated information stream onto a radio frequency (RF) carrier frequency for subsequent distribution to one or more information consumers.

FIG. 1 depicts a high level block diagram of a multiple carrier frequency "up conversion" system. Specifically, the up converter 100 of FIG. 1 comprises a controller 105, a plurality of (i.e., N) quadrature amplitude modulators (QAM) 110-1 through 110-N (collectively modulators 110), a corresponding plurality of low-pass filters 120-1 through 120-N (collectively low-pass filters 120), a frequency summation module 130, a first mixer 140, a first local oscillator 145 having associated with it a crystal 145X, a band-pass filter 150, a second mixer 160, a second local oscillator 165 having associated with it a crystal 165X, and a final low-pass filter 170.

The up conversion system 100 of FIG. 1 receives a plurality of (i.e., N) input signals S1-1 through S1-N (collectively input signals S1). Each of the input signals S1 is received by a respective one of the modulators 110. Each of the modulators 110 modulates the respective received input signal S1 onto a respective intermediate frequency (IF) carrier frequency to produce respective output signals S2-1 through S2-N (collectively IF signals S2).

First modulator 110-1, in response to a control signal MC-1 produced by the controller 105, modulates first input signal S1-1 onto, illustratively, a 44 MHz carrier frequency to produce first intermediate frequency (IF) carrier signal S2-1. Similarly, second modulator 110-2, in response to a control signal MC-2 produced by the controller 105, modulates second input signal S1-2 onto, illustratively, a 38 MHz carrier frequency to produce the second IF carrier signal S2-2. Finally, assuming that N=3, third modulator 110-N, in response to a control signal MC-N produced by the controller 105, modulates third input signal S-N onto, illustratively, a 32 MHz carrier frequency to produce third IF carrier signal S2-N.

Each of the IF carrier signals S2-1 through S2-N are coupled to a respective low pass filter 120-1 through 120-N. The low-pass filters 120 have cutoff frequencies selected to filter out at least the respective second harmonics of the IF carrier signals S2-1 through S2-N. Each of the low-pass filters 120 produces a corresponding low-pass filter output signal S3-1 through S3-N (collectively low-pass filtered signals S3) which is coupled to a respective input of frequency summation module 130.

The frequency summation module 130 combines the low-pass filtered signals S3 to produce a summed or "stacked" IF signal S4 comprising a plurality of IF modulated signals. The stacked IF signal S4 is coupled to a first input of first mixer 140.

Referring to FIG. 1, a spectral diagram of the output of summation module 130 is depicted with reference to the output signal S4. Specifically, the spectral diagram shows the IF carrier signal frequencies of modulators 110-1 and 110-2 in the exemplary embodiment (i.e., 38 MHz and 44 MHz). It can be seen that the IF carrier signals are spectrally separated by 6 MHz. This 6 MHz separation was selected in response to standard television signal separation parameters. In the case of N being greater than 2, additional modulators 110 produce additional IF carrier frequencies of, e.g., 26 MHz, 32 MHz, 50 MHz, 56 MHz and the like.

A second input of first mixer 140 receives a 906 MHz oscillation signal S5 from a first local oscillator 145, illustratively a fixed frequency synthesizer cooperating with the first crystal 145X.

The first mixer 140 mixes the stacked IF signal S4 and the 906 MHz oscillation signal S5 to produce an output signal S6 comprising a 906 MHz carrier signal having upper and lower side bands including the signal information within the stacked IF signal S4 and its mirror image. The output signal S6 produced by the first mixer 140 is coupled to the band-pass filter 150.

Band-pass filter 150 comprises, illustratively, a 947 MHz dielectric band-pass filter having a 24 MHz bandwidth. Thus, a band-pass filter 150 will pass those frequencies between approximately 935 MHz and 959 MHz. In the case of the system of FIG. 1 utilizing on a 44 MHz modulator (e.g., 110-1) and a 38 MHz modulator (e.g., 110-2), the 947 MHz center frequency 24 MHz bandwidth is appropriate. However, in the case of a third modulator (e.g., 110-N) utilizing a 32 MHz carrier frequency, the band-pass filter 150 is adapted to have a 36 MHz passband and a 944 MHz center frequency. More generally, the band-pass filter 150 is adapted to have approximately an N*12 MHz pass band centered upon the a median frequency of the modulation frequencies (assuming the modulation frequencies comprise contiguous grouping of carrier frequencies).

Referring to FIG. 1, a spectral diagram of the output of local oscillator 145 is depicted with reference to the output signal S6. Specifically, since the oscillation frequency (906 MHz) is greater than the frequency of the two IF carrier signals (i.e., 38 MHz and 44 MHz), the first mixer 140 output signal S6 includes a summation frequency group (i.e., the upper sideband) and a difference frequency group (i.e., the lower sideband). Thus, as depicted in the spectral diagram, the operation of the band-pass filter 150 will remove all frequency components except those associated with the relevant portion of the upper sideband.

The output of the band-pass filter 150 comprises a band-pass filtered signal S7 that is coupled to a first input of the second mixer 160. A second input of the second mixer 160 receives an oscillation signal S8 from the second local oscillator 165, illustratively a variable frequency synthesizer responsive to a control signal OC produced by the controller 105, provides an output oscillation ranging in frequency from 1347 MHz to 1807 MHz in 1 MHz steps. That is, the oscillation signal S8 is modified by the second local oscillator 165 in steps of 1 MHz between 1347 MHz to 1807 MHz.

The second mixer 160 mixes the band-pass filter signal S7 and the adjustable oscillator signal S8 to produce a output signal S9 comprising the stack of converted IF signals and their respective image frequencies.

It is important to note that the second local oscillator 165 provides a relatively course frequency adjustment suitable for locating the stacked IF signal information into one of a plurality of spectral regions. Since these spectral regions are adjusted in 1 MHz steps, the impact of phase noise upon the frequency accuracy of the second local oscillator 165 is relatively low.

The output signal S9 produced by the second mixer 160 is coupled to a low-pass filter 170, illustratively a 1 GHz low-pass filter. The low-pass 170 attenuates those frequencies above 1 GHz to produce an output RF signal S10, which is coupled to transmission circuitry (not shown). The cutoff frequency is selected based upon the maximum RF frequency utilized by the system (i.e., approximately 900 MHz).

Referring to FIG. 1, a spectral diagram of the lower sideband produced by the second mixer 160 and a frequency response of the low-pass filter 170 is depicted with reference to the output signal S10. Specifically, since the second oscillation frequency ranges from 1347 MHz to 1807 MHz, the low-pass filter 170 operates to attenuate the upper sideband of the second mixed signal S9.

It should be noted that the low pass filters 120 are depicted in FIG. 1 as being between the respective modulators 110 and the summation module 130. In this manner, relatively straightforward low pass filters may be employed to perform the necessary second harmonic reduction and/or removal function. However, it should be noted that a single filter may be coupled between the summation module 130 and the first mixer 140 to achieve the same purpose. This single filter may comprise a low pass filter if the respective second harmonics do not intrude into spectral regions including frequencies of interest. This single filter may also comprise a comb filter.

In the embodiment of FIG. 1 the modulators 110 are implemented using model BCM 3033 QAM modulators by Broadcom, Inc. of Irvine, Calif. Since it is typical for the frequency setability or step size of most commercial modulators to be in steps of 125 KHz with a 12.5 KHz and 25 KHz offset capability, at least one of the local oscillator (LO) synthesizers in the upconverter must have a phase detector comparison frequency of 12.5 KHz to satisfy the 12.5 KHz offset requirement. Since a 12.5 KHz comparison frequency with VCO frequencies in the hundreds of MHz promotes phase noise in the VCO, it is desirable to use the highest possible comparison frequency in the LO synthesizers and still maintain setability. The BCM 3033 is utilized, at least in part, because of its frequency setting capability.

The invention provides for reductions in the phase noise of the local oscillators by increasing the comparison frequency of the synthesizers to 1 MHz, while also increasing the frequency setability or frequency step size of the upconverter to less than 100 Hz at the highest frequency of, illustratively, 860 MHz. The frequency setting resolution of this embodiment is achieved by utilizing two frequency setting elements. The first element is the modulator 110, which is used for fine frequency adjustment of less than 100 Hz. The second element is the frequency synthesizer in the second local oscillator 165, which provides the coarse frequency adjustment of 1 MHz steps.

Because the modulator 110 (such as the BCM 3033 QAM Modulator) uses Direct Digital Synthesis (DDS) to generate its IF output, excellent spectral purity and extremely low phase noise can be achieved. Additionally, since the phase comparison frequency of both the first 145 and second 165 local oscillators is kept as high as 1 MHz (rather than the 12.5 KHz used in conventional upconverter technology), additional phase noise reduction over existing agile upconverter technology is realized.

Advantageously, the above-described invention provides for the processing of a plurality of modulated IF carriers by a single upconverter. Additionally, a type of noise typically associated with the agile upconversion process itself is reduced. This noise, if excessive, causes errors in digital signals when said signals are transported over coaxial cable or fiber optical cable systems.

Although various embodiments which incorporate the teachings at the present invention have been shown and described in detail herein, those skilled in the art can readily devise many other varied embodiments that still incorporate these teachings.

What is claimed is:

1. An upconverter, comprising:
   a plurality of modulators for modulating respective information signals onto respective intermediate frequency carrier signals, said respective IF carrier signals being separated by a predetermined frequency;
   a summation module, for summing said plurality of IF carrier signals to produce a stacked IF carrier signal:
   a first mixer and first filter, for spectrally shifting and filtering said stacked IF carrier signal to a first radio frequency (RF) range determined by a first oscillator signal; and
   a second mixer and second filter, for spectrally shifting and filtering information within said first RF range to one of a plurality of spectral portions within a second RF range to produce an upconverted signal, said second RF range determined by a second oscillator signal and comprising frequencies less than said first RF range and greater than said IF carrier signals, said second oscillator signal comprising a selectable oscillator signal.

2. The upconverter of claim 1, further comprising:
   a plurality of low pass filters, each of said low pass filters being coupled to said summation module, for removing at least second harmonic frequencies from each IF carrier signal.

3. The upconverter of claim 1, further comprising:
   a filter, coupled to said first mixer, for removing at least second harmonic frequencies of said IF carrier signals from said stacked IF carrier.

4. The upconverter of claim 3, wherein said filter comprises one of a low pass filter and a comb filter.

5. The upconverter of claim 1, wherein said predetermined frequency comprises 6 MHz.

6. The upconverter of claim 5, wherein at least one of said IF carrier signals is between approximately 20 MHz and 50 MHz.

7. The upconverter of claim 5, wherein second frequency range is below approximately 1 GHz.

8. The upconverter of claim 1, wherein said first mixer receives a mixing frequency selected to correspond to a maximum desirable output frequency.

9. The upconverter of claim 8, wherein said second mixer receives a mixing frequency selected to correspond to said one of said plurality of spectral portions within said second RF range.

10. A method, comprising the steps of:
    modulating each of a plurality of information signals onto respective intermediate frequency carrier signals, said respective IF carrier signals being separated by a predetermined frequency;
    summing said plurality of IF carrier signals to produce a stacked IF carrier signal;
    spectrally shifting and filtering said stacked IF carrier signal to a first radio frequency (RF) range; and
    spectrally shifting and filtering information within said first RF range to one of a plurality of spectral portions within a second RF range to produce an upconverted signal, said second RF range comprising frequencies less than said first RF range and greater than said IF carrier signals.

11. The method of claim 10, further comprising the step of:
    removing at least second harmonic frequencies from each IF carrier signal.

12. The method of claim 10, further comprising the step of:
    removing at least second harmonic frequencies of said IF carrier signals from said stacked IF carrier.

13. The method of claim 10, wherein said predetermined frequency comprises 6 MHz.

14. The method of claim 13, wherein at least one of said IF carrier signals is between, approximately, 20 MHz and 50 MHz.

15. The method of claim 10, wherein said second RF range is below approximately 1 GHz.

16. The method of claim 10, wherein said first RF range is selected to correspond to a maximum desirable output frequency.

17. In an upconverter, apparatus comprising:
    means for modulating each of a plurality of information signals onto respective intermediate frequency carrier signals, said respective IF carrier signals being separated by a predetermined frequency;
    means for summing said plurality of IF carrier signals to produce a stacked IF carrier signal;
    means for spectrally shifting and filtering said stacked IF carrier signal to a first radio frequency (RF) range; and
    means for spectrally shifting and filtering information within said first RF range, to one of a plurality of spectral portions within a second RF range to produce an upconverted signal, said second RF range comprising frequencies less than said first RF range and greater than said IF carrier signals.

18. The apparatus of claim 17, further comprising:
    means for removing at least second harmonic frequencies from each IF carrier signal.

19. The apparatus of claim 17, further comprising:
    means for removing at least second harmonic frequencies of said IF carrier signals from said stacked IF carrier.

20. The apparatus of claim 19, wherein at least one of said IF carrier signals is between, approximately, 20 MHz and 50 MHz.

21. The apparatus of claim 17, wherein said predetermined frequency comprises 6 MHz.

22. The apparatus of claim 17, wherein said second RF range is below approximately 1 GHz.

23. The apparatus of claim 17, wherein said first RF range is selected to correspond to a maximum desirable output frequency.

* * * * *

UNITED STATES PATENT AND TRADEMARK OFFICE
CERTIFICATE OF CORRECTION

PATENT NO. : 6,477,182 B2  Page 1 of 1
DATED : November 5, 2002
INVENTOR(S) : Theodore Calderone It is certified that error appears in the above-identified patent and that said Letters Patent is hereby corrected as shown below:

Column 2,
Line 65, "S-N" should be -- S1-N --.

Column 3,
Line 41, "on" should be -- only --.

Column 4,
Line 21, before "170" insert -- filter --.

Column 5,
Line 33, change the colon ":" to a semicolon -- ; --.

Signed and Sealed this

Eighteenth Day of February, 2003

JAMES E. ROGAN
*Director of the United States Patent and Trademark Office*